United States Patent [19]

Matsumiya et al.

[11] 4,344,380
[45] Aug. 17, 1982

[54] APPARATUS FOR APPLYING PHOTO RESIST ON BOTH SURFACES OF SEMICONDUCTOR WAFER

[75] Inventors: Ritsuo Matsumiya; Mitsuaki Osawa, both of Omiya, Japan

[73] Assignee: M. Setek Company Limited, Tokyo, Japan

[21] Appl. No.: 217,544

[22] Filed: Dec. 17, 1980

[30] Foreign Application Priority Data

Dec. 18, 1979 [JP] Japan .............................. 54-163926

[51] Int. Cl.$^3$ .............................................. B05C 13/02
[52] U.S. Cl. ...................................... 118/66; 118/314; 118/324; 118/503; 427/209; 430/313
[58] Field of Search ................. 118/66, 324, 314, 223, 118/503; 427/209, 210, 211, 294, 108, 110, 376.2, 379, 165, 168; 271/186, 66, 83; 198/379, 402, 403; 430/313, 314

[56] References Cited

U.S. PATENT DOCUMENTS

| | | | |
|---|---|---|---|
| 2,723,921 | 11/1955 | Starkey | 118/314 |
| 3,173,804 | 3/1965 | Standfuss | 118/66 |
| 3,610,397 | 10/1971 | Bok | 118/503 |
| 3,986,476 | 10/1976 | Yano | 118/314 |
| 4,060,052 | 11/1977 | Algeri et al. | 118/324 |

Primary Examiner—Ralph S. Kendall
Attorney, Agent, or Firm—Toren, McGeady & Stanger

[57] ABSTRACT

An apparatus for applying photo resist on both surfaces of a semiconductor wafer is disclosed. The apparatus comprises a first conveying section for successively conveying semiconductor wafers one by one, a first photo resist application section provided on the way of the conveying section, a first drying section provided on the way of said first conveying section in the order after the first photo resist application section, a second conveying section connected to said first conveying section for successively conveying semiconductor wafers one by one, a reversing section provided on the way of the second conveying section for reversing the semiconductor wafer, a third conveying section connected to said second conveying section for successively conveying semiconductor wafers one by one, a second photo resist application section provided on the way of the third conveying section, and a second drying section provided on the way of said third conveying section in the order after the second photo resist application section.

6 Claims, 9 Drawing Figures

APPARATUS FOR APPLYING PHOTO RESIST ON BOTH SURFACES OF SEMICONDUCTOR WAFER

BACKGROUND OF THE INVENTION

The present invention relates to an apparatus for applying photo resist on both surfaces of a semiconductor wafer, particularly to an apparatus for applying photo resist on both surfaces of a semiconductor wafer for obtaining a homogeneous photo resist layer.

In case of manufacturing integrated circuits or the like, the technique of so-called photo-etching has been used, and one process thereof involves the step of applying photo resist on the surface of a semiconductor wafer and drying it. Each process of photo-etching exerts an influence upon resolution of a pattern in an integrated circuit, so that in order to obtain an integrated circuit of good quality, it is necessary to uniformly apply and dry photo resist.

In order to manufacture silicone wafer as the material of a semiconductor wafer, a large amount of electric power is required, and as a result, silicone wafer becomes expensive. In order to effectively utilize such expensive silicone wafer these days, photo resist is applied to the back surface of the silicone wafer and a circuit is formed on both surfaces thereof.

Hitherto, for applying photo resist on both surfaces of a semiconductor wafer, a plurality of wafers have been accommodated in a cassette, the cassette being set at one end of a photo resist applying apparatus, and the wafers being successively supplied one by one from the cassette to the applying apparatus. One surface of the wafer has applied thereto dried photo resist by the applying apparatus and the wafer is successively accommodated in the cassette provided at the other end of the applying apparatus. These wafers are reversed and replaced in another cassette for applying photo resist to the rear surface of the wafer.

This reversed cassette is again set at one end of the photo resist applying apparatus, photo resist is applied to the rear surface of the wafer in the same process as described above, and then the photo resist applied wafer is accommodated in a cassette at the other end.

After this cassette is dried by putting in into a drier, an exposure operation is carried out in a succeeding apparatus exposing both surfaces.

As described above, the means for applying photo resist to both surfaces comprises a plurality of separate processes, takes trouble, and much time is taken between a process for applying photo resist on the front surface and a process for applying photo resist on the rear surface. Therefore, the quality of photo resist applied on both surfaces becomes uneven due to change of working surrounding or the like, during which interval dust which is highly deleterious in a semiconductor is adhered thereto.

SUMMARY OF THE INVENTION

An object of the present invention is to eliminate the above described disadvantages of the conventional apparatus.

Another object of the present invention is to provide an apparatus for applying photo resist on both surfaces of a semiconductor wafer by providing a wafer reversing mechanism between a photo resist surface application section and a rear surface application section to the semiconductor wafer, and applying photo resist on both surfaces in a short time, thereby homogenizing photo resist on both surfaces and obtaining an element having excellent precision with no adhesion of dust.

According to the present invention there is provided an apparatus for applying photo resist on both surfaces of a semiconductor wafer, comprising a first conveying section for successively conveying semiconductor wafer one by one, a first photo resist application section provided on the way of the conveying section, a first drying section provided on the way of said first conveying section in the order after the first photo resist application section, a second conveying section connected to said first conveying section for successively conveying semiconductor wafer one by one, a reversing section provided on the way of the second conveying section for reversing the semiconductor wafer, a third conveying section connected to said second conveying section for successively conveying semiconductor wafer one by one, a second photo resist application section provided on the way of the third conveying section, and a second drying section provided on the way of said third conveying section in the order after the second photo resist application section.

DESCRIPTION OF THE PREFERRED EMBODIMENT

Figure 1:
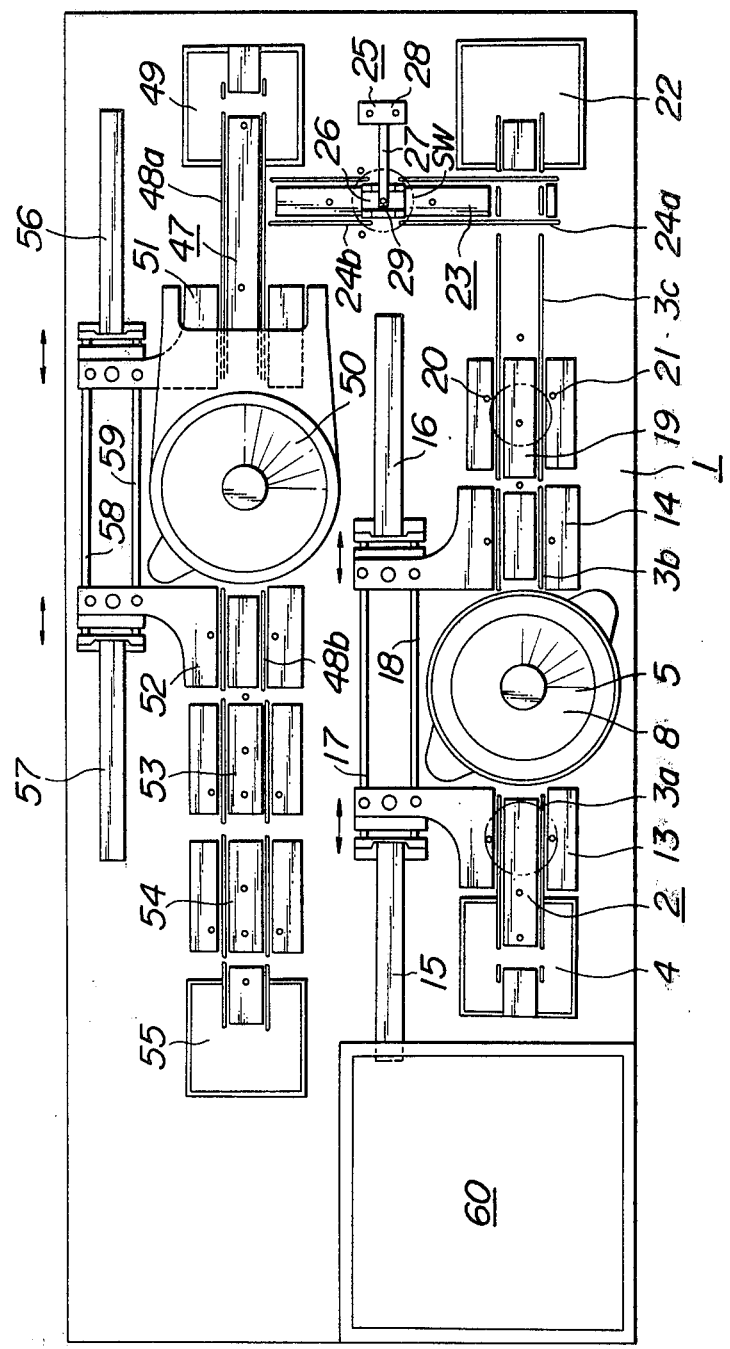
FIG. 1 is a plan view showing one embodiment of an apparatus for applying photo resist on both surfaces of a semiconductor wafer according to the present invention.

Referring now to the drawings, wherein the same reference characters designate similar or corresponding parts throughout the several views, there is described an apparatus for applying photo resist on both surfaces of a semiconductor wafer according to the present invention.

Figure 2:
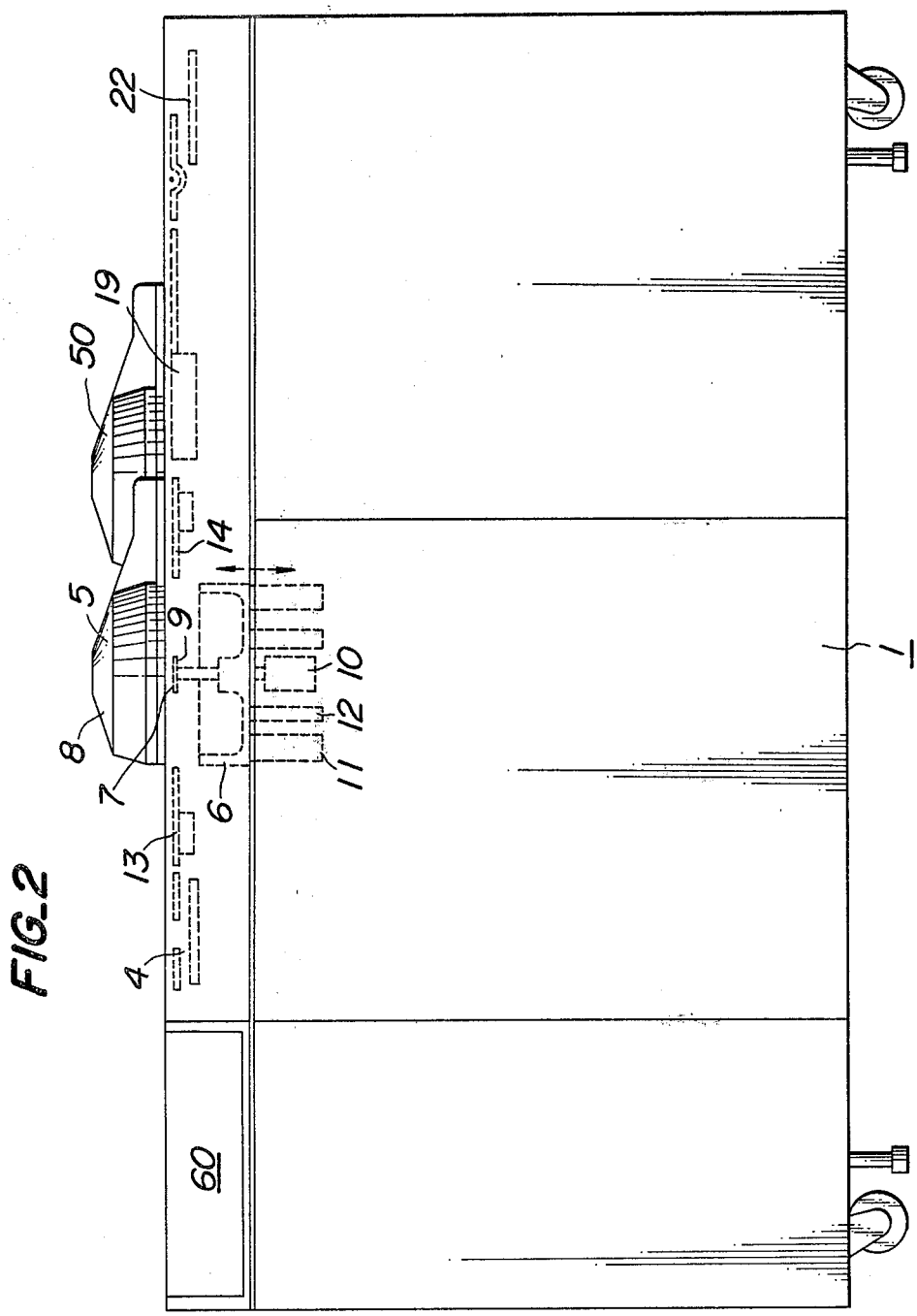
FIG. 2 is a front view showing the apparatus shown in FIG. 1.

In FIGS. 1 and 2, reference numeral 1 is a main body of this apparatus, and on the upper surface of the body 1 is formed a first conveying section 2 for conveying a semiconductor wafer. As a concrete structure of the conveying section 2, use is made of endless belts 3a, 3b, 3c . . . such as rubber or the like.

At the start end of the first conveying section 2 there is formed a first cassette mounting section 4. On the cassette mounting section 4 there is mounted a cassette provided with a plurality of racks which move one by one in the vertical direction so as to feed a semiconductor wafer SW one by one onto the first conveying section 2.

On the way of the first conveying section 2 there is provided a first photo resist application section 5. The photo resist application section 5 comprises a lower vessel 6, a vacuum chuck 7 rotated at the center thereof and a lid 8. The vacuum chuck 7 is provided at the top portion with a disc-like suction portion 9 which sucks and rotates the semiconductor wafer SW by a motor 10. Moreover, the lower vessel 6 is pushed up by a cylinder device (not shown) in case of applying photo resist to the semiconductor wafer SW, so as to adhere to the lid 8. On the lower vessel 6 are mounted a suction pipe 11 and an exhaust pipe 12 of photo resist stored in the lower portion.

A first slidable table 13 and a slidable table 14 are provided on both sides of the first photo resist application section 5. These slidable tables 13 and 14 are freely movable up and down by a cylinder device (not shown), and are freely movable in the direction of arrows shown in FIG. 1 along guides 17 and 18 by cylinder 15 and 16.

Next to the second slidable table 14 is provided a first drying section 19. In the drying section 19 are freely formed stop pins 20 and 21, and there is employed a hot plate system for heating.

At the terminal end of the first conveying section 2 is formed a second cassette mounting section 22. On this second cassette mounting section 22 is mounted a cassette provided with a plurality of racks, so as to successively accommodate the semiconductor wafer SW on which application of photo resist is completed one by one by mounting the racks one by one in the vertical direction. However, this cassette cannot be used when photo resist is applied to the rear surface immediately after application to the surface of the semiconductor wafer SW.

A second conveying section 23 is provided in the direction perpendicular to the terminal end of the first conveying section 2. The conveying section 23 also comprises endless belts 24a, 24b . . . in the same manner as the case of the first conveying section 2. On the way of the second conveying section 23 is provided a reversing section 25 for reversing the semiconductor wafer SW. The reversing section 25 comprises a suction portion 26 to the semiconductor wafer SW, an arm portion 27 for supporting the suction portion 26, and a driving portion 28 including a mechanism for reversing the arm portion 27 and a mechanism for moving the arm 27 in the vertical direction.

Figure 3:
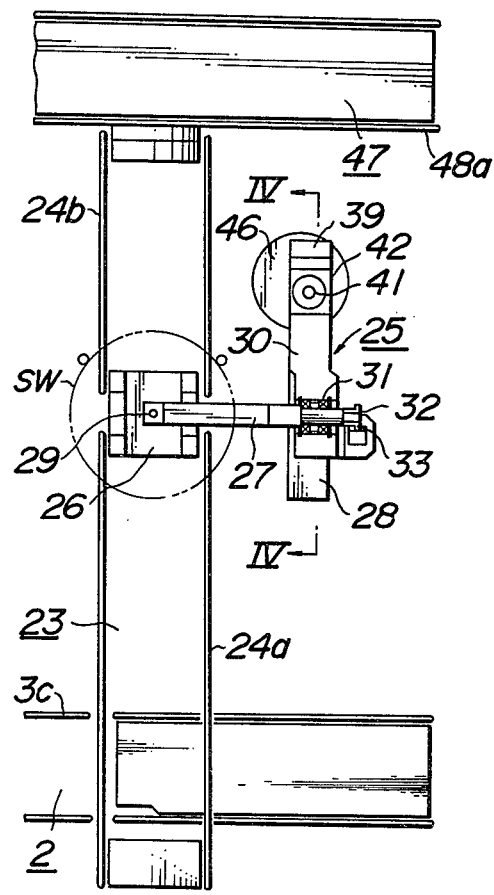
FIG. 3 is a plan view showing a reversing section used in the apparatus shown in FIG. 1.
Figure 4:
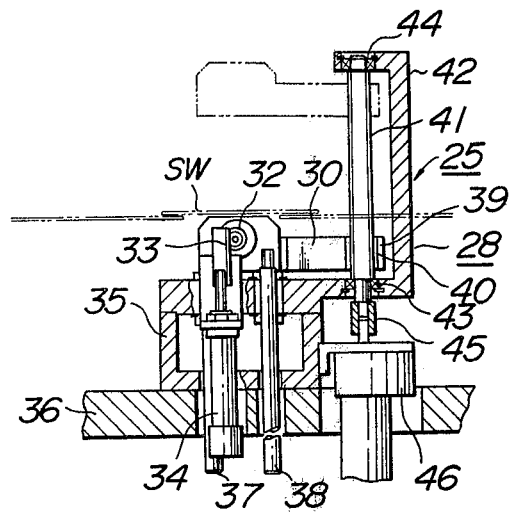
FIG. 4 is a fragmentary sectional view showing the reversing section shown in FIG. 3.

FIGS. 3 and 4 show the reversing section 25 in detail. The suction portion 26 is provided with a suction hole 29 at the center and supported by the arm portion 27. The arm portion 27 is rotatably supported on a movable member 30 by a bearing 31 and provided with a pinion 32 at the end. Reference numeral 33 is a rack meshed with the pinion 32 and driven by a reversing cylinder device 34. The movable member 30 is provided with a pair of slidable levers 37 and 38 which slide through a support 35 and a base 36, and a screw hole 40 is formed at one end of an extended portion 39. Reference numeral 41 is a screw bar threaded with the screw hole 40 and rotatably supported on a support portion 42 formed by projecting from the support 35 by bearings 43 and 44. The base end of the screw bar 41 is coupled to the shaft of a vertically driving motor 46 by a coupling 45.

As described above, the reversing section 25 moves in the vertical direction when the screw bar 41 is rotated with a rotation of the motor 46 and the movable member 30 is guided by the slidable levers 37 and 38 through the screw bar 41 and the screw hole 40. When the rack 33 is driven by the reversing cylinder device 34, the arm portion 27 is rotated meshing with the pinion 32 so as to reverse the suction portion 26.

Again back to FIGS. 1 and 2, a third conveying section 47 is formed in the direction perpendicular to the extension of the second conveying section 23. Hence, the conveying section 47 is in the condition parallel to the first conveying section 2.

The third conveying section 47 is also provided with endless belts 48a, 48b . . . made of rubber or the like. At the start end of the third conveying section 47 is provided a third cassette mounting section 49, the third conveying section 47 comprises on the way thereof a second photo resist application section 50, a third slidable table 51, a fourth slidable table 52, and a second section 54, and at the terminal end of the third conveying section 47 is provided a fourth cassette mounting portion 55. Moreover, reference numerals 56 and 57 are cylinder devices for driving the slidable tables 51 and 52, while reference numerals 58 and 59 are guides therefor.

Each portion provided in the third conveying section 47 corresponds to the cassette mounting section 4 of the first conveying section 2, the photo resist application section 5, the slidable tables 13 and 14, the cylinder devices 15 and 16, the drying section 19 and the cassette mounting section 22, respectively, and has almost the same construction.

In addition, the first and third conveying sections 2, and 47 are provided with a stop pin for stopping the semiconductor wafer SW, a suction hole for suction or an air hole for removing it from the conveying surface or the like at any suitable position.

Reference numeral 60 is a control section for controlling the whole apparatus.

The action of the apparatus according to the invention will be explained. In the first place, the cassettes mounted on the first cassette mounting section 4 are moved one by one in the vertical direction, and the semiconductor wafer SW are supplied one by one to the start end of the first conveying section 2. These semiconductor wafers SW are stopped at the position of the first slidable table 13, the slidable table 13 is raised by a cylinder device (not shown), moved forward in the direction of the first photo resist application section 5 by the cylinder device 15, and then lowered for placing the semiconductor wafers SW on the suction portion 9 of the vacuum chuck 7. At this time, the suction pipe 11 serves to suck the semiconductor wafers SW and the slidable table 13 is back to the original position.

At the first photo resist application section the lower vessel 6 is pushed up by a cylinder device (not shown) so as to adhere to the lid 8, the suction portion 9 is rotated by the motor 10, and the semiconductor wafers SW are rotated.

Under such condition, a photo resist solution is dropped from the upper portion and uniformly applied on the surface of the semiconductor wafer SW. The motor 10 is here stopped and the lower vessel 6 is lowered.

The second slidable table 14 is then moved to the photo resist application section 5 by the cylinder device 16, raised to suck the semiconductor wafer SW, restored to the original position and further lowered, thereby placing the semiconductor wafers SW on the first conveying section 2.

The semiconductor wafers SW are conveyed to the first drying section 19 by driving the belt and stopped by the stop pins 20 and 21, and simultaneously sucked by the suction hole and heated at a temperature of 120°–135° C. for 30–45 seconds. The semiconductor wafers SW on which photo resist has been applied and dried are again conveyed onto the first conveying section 2 and replaced onto the second conveying section 23 at the terminal end.

The semiconductor wafers SW conveyed onto the second conveying section 23 are soon stopped at the position of the reversing section 25. The semiconductor wafers SW are sucked to the suction portion 26 by the suction hole 29, and the movable member 30 is raised by the motor 46. Then, the arm portion 27 is rotated by meshing the rack 33 with the pinion 32 by the reversing cylinder device 34, so that the semiconductor wafers SW are reversed.

The movable member 30 is lowered by driving the motor 46 in the reverse direction, and the suction of the semiconductor wafers SW is released under the state of placing on the second conveying section 23.

The reversed semiconductor wafers SW are again conveyed to the second conveying section 23, conveyed to the third conveying section 47 at the terminal end, uniformly applied photo resist on the rear surface at the second photo resist application section 50 by tracing the process similar to the case of the first conveying section 2 as explained above, dried plural times at the second and third drying sections 53 and 54, and successively accommodated in the cassette prepared in the fourth cassette mounting section 55. In this connection, numerical values of the drying process are, for example, 60°–70° C. for 15–25 seconds at the second drying section and 110°–120° C. for 15–25 seconds at the third drying section.

The semiconductor wafers on which photo resist has been applied on both surfaces are exposed in the next both surface exposing device and then etched.

The apparatus according to the invention is characterized in the provision of the reversing section on the way of the conveying section, thereby continuously applying photo resist on both surfaces of the semiconductor wafer for a very short time. Therefore, there is no possibility of causing unevenness owing to the condition of paint, change of working surroundings or the like as compared with the conventional case which takes a long time between the process of applying photo resist on the surface and the process of applying it on the rear surface, and of adhering dust. Thus, uniform application of photo resist of good quality can be carried out, so that a semiconductor element having high precision can be obtained.

The application and drying of photo resist are continuously operated, so that the efficient operation can be carried out and the invention is suitable for mass-production.

The above described apparatus can be used for applying photo resist twice on one surface when using no reversing section, which means that the apparatus can comply with a demand of making a photo resist applied layer thick. Moreover, with the use of the second and third cassette mounting sections 22 and 29, if the first and second conveying sections 2 and 23 are separately used, one surface application can be carried out, and the invention can be said to be multifunctional.

In addition, the invention is not limited to the above embodiment, but can be modified without departing from the scope of the invention.

For example, the construction of the reversing section, photo resist application section, drying section or the like is not limited to those illustrated in the drawings. There is shown the conveying section with the use of endless rubber belt for semiconductor wafers, but it is possible to use other means such as the so-called air bearing or the like.

Moreover, in order to more surely improve the action of the apparatus according to the invention, the following construction can be taken in each part.

Figure 5:
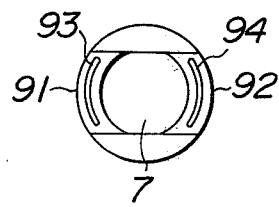
FIG. 5 is a plan view showing another embodiment of the vacuum chuck used in the apparatus shown in FIG. 1.

That is, the vacuum chuck 7 can be made, as shown in FIG. 5, by forming arcuate fine holes 93 and 94 for suction in a pair of arcuate projections 91 and 92 and positively holding the semiconductor wafer SW.

Figure 6:
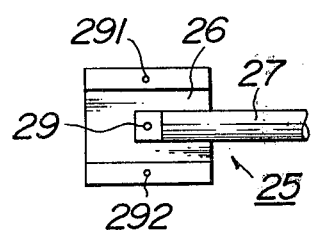
FIG. 6 is a plan view showing another embodiment of the reversing section used in the apparatus shown in FIG. 1.

In the same manner, as shown in FIG. 6 the suction portion 26 of the reversing section 25 is provided with a pair of fine holes 291 and 292 for suction at the upper and lower end portions besides the suction hole 29 at the center, so as to positively hole the semiconductor wafer SW.

Figure 7:
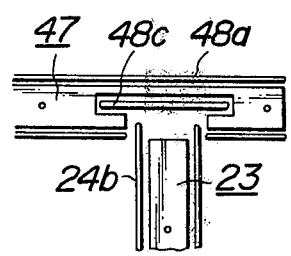
FIG. 7 is a plan view showing another embodiment of the crossing section of second conveying section and third conveying section shown in FIG. 1.

Moreover, in order to smoothly deliver the semiconductor wafer SW between the orthogonal conveying sections, as shown in FIG. 7 for example, the crossing section of the second conveying section 23 and the third conveying section 47 can be improved, that is another endless belt 48c is provided besides the endless belt 48a, while the endless belt 24b of the second conveying section 23 is projected into the third conveying section 47. Therefore, the newly provided endless belt 48c can smoothly convert the direction of the semiconductor wafer SW.

Figure 8:
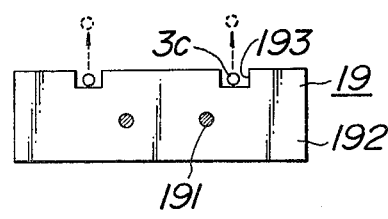
FIG. 8 is a sectional view showing the operation of the drying section shown in FIG. 1.

FIG. 8 shows enhanced efficiency of heating by keeping close the distance between the semiconductor wafer SW and the heater at the drying section. When this is illustrated with the first drying section 19, a groove 193 is formed in a holder 192 of the heater 191, the endless belt 3c is provided in this groove, the belt 3c or one of the holder 192 is vertically moved, thereby to adjust distance between the semiconductor wafer SW and the heater 191.

Figure 9:
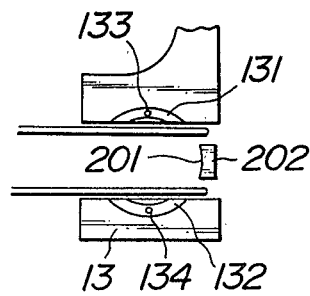
FIG. 9 is a plan view showing another embodiment of the slidable table used in FIG. 1.

FIG. 9 shows the provision of groove 131 and 132 for accommodating the semiconductor wafer SW as illustrated in order to positively hold the semiconductor wafer SW. In FIG. 9, reference numerals 133 and 134 are suction holes. Moreover, in order to precisely stop the conveyed semiconductor wafer SW on the center line of the conveying section, there is provided a position regulator 202 provided with a circular stop surface 201.

As described above, the invention can provide an apparatus for applying photo resist on both surfaces of a semiconductor wafer reversing mechanism between an application section for applying photo resist on the surface of the semiconductor wafer and an application section for applying photo resist on the rear surface so as to apply photo resist on both surfaces homogeneously without adhering any dust.

While specific embodiments of the invention have been shown and described in detail to illustrate the application of the inventive principles, it will be understood that the invention may be embodied otherwise without departing from such principles.

What is claimed is:

1. Apparatus for applying photo resist on two opposite surfaces of a semiconductor wafer comprising:

a first conveying section defining a first conveying path for individually successively conveying semiconductor wafers into said apparatus;

a first photo resist application section located within said first conveying path of said first conveying section for applying photo resist material to one side of said wafers;

a first drying section located within said first conveying path of said first conveying section in sequence after said first photo resist application section for drying said wafers;

a second conveying section arranged in operative association with said first conveying section for receiving wafers therefrom, said second conveying section defining a second conveying path for individually successively conveying semiconductor wafers therethrough;

a reversing section provided within said second conveying path of said second conveying section for turning said wafers upside down;

a third conveying section arranged in operative association with said second conveying section for receiving wafers therefrom, said third conveying section defining a third conveying path for individually successively conveying semiconductor wafers therethrough;

a second photo resist application section located within said third conveying path of said third conveying section for applying photo resist material to the side of said wafers opposite said one side; and a second drying section located within said third conveying path of said third conveying section in sequence after said second photo resist application section for drying said wafers.

2. An apparatus for applying photo resist on both surfaces of a semiconductor wafer as claimed in claim 1, wherein said first and third conveying paths defined by said first and third conveying sections are provided in parallel with each other and wherein said second conveying path defined by said second conveying section is provided perpendicular to said first and third conveying sections.

3. An apparatus for applying photo resist on both surfaces of a semiconductor wafer as claimed in claim 1, wherein a cassette mounting section is provided at least at the start end of said first conveying section and the terminal end of said third conveying section.

4. An apparatus for applying photo resist on both surfaces of a semiconductor wafer as claimed in claim 1, wherein each start end and each terminal end of said first conveying section and third conveying section are provided with cassette mounting sections, respectively.

5. An apparatus for applying photo resist on both surfaces of a semiconductor wafer as claimed in claim 1, wherein said reversing section comprises a suction portion for sucking the semiconductor wafer, an arm portion for supporting the suction portion, and a driving portion including a mechanism for reversing the arm portion and a mechanism for moving in the vertical direction.

6. An apparatus for applying photo resist on both surfaces of a semiconductor wafer as claimed in claim 1, wherein a third drying section is provided in the order after said second drying section.

* * * * *